Thomas R. Perry
INVENTOR.

BY

April 28, 1970 T. R. PERRY 3,508,325

METHOD OF MAKING INSULATION STRUCTURES FOR CROSSOVER LEADS IN INTEGRATED CIRCUITRY

Original Filed Jan. 25, 1965 5 Sheets-Sheet 2

Thomas R. Perry
INVENTOR.

BY

Thomas R. Perry
INVENTOR.

BY

Thomas R. Perry
INVENTOR.

BY

Thomas R. Perry
INVENTOR

BY

United States Patent Office 3,508,325
Patented Apr. 28, 1970

3,508,325

METHOD OF MAKING INSULATION STRUCTURES FOR CROSSOVER LEADS IN INTEGRATED CIRCUITRY

Thomas R. Perry, Dallas, Tex., assignor to Texas Instruments Incorporated, Dallas, Tex., a corporation of Delaware Original application Jan. 25, 1965, Ser. No. 427,831, now Patent No. 3,436,611. Divided and this application June 26, 1968, Ser. No. 778,872
Int. Cl. H01j *1/16*
U.S. Cl. 29—577 3 Claims

ABSTRACT OF THE DISCLOSURE

Disclosed are methods of fabricating lead arrangements for integrated circuits having multiple levels of conductive leads separated by insulated layers at the surface of a semiconductor substrate wherein an insulating layer spaced from a substrate surface preferably comprises a photo definable material.

This is a division of application Ser. No. 427,831, filed Jan. 25, 1965, now Patent No. 3,436,611.

This invention relates to monolithic semiconductor device networks and more particularly to contacts, external leads and crossover leads therefor.

As technology advances, more and more active and passive elements are being crowded into monolithic semiconductor networks, increasing the number of elements thereon and crowding them into progressively smaller spaces. This reduction in size presents a serious problem of making internal connections between the elements of the network and external connections thereto. Some attempt has been made to remedy this situation by making a "sandwich" structure with insulating slabs of alumina. Another technique is to bound external leads onto the network, jumping over the various areas similar to conventional wiring. This method presents a problem of bonding the wires to the minute contact areas.

A desirable technique would be to make a solid package wherein the bonding of jumper wires is made unnecessary, by constructing a multilayer device wherein the interconnections are made in thin layers, and insulated from the other layers by an insulating material. In this manner, larger contact areas may be provided for external connections to the devices of the network.

Previous attempts at producing multilayered interconnections in monolithic integrated circuits have employed materials for the insulating layers which have not been entirely satisfactory. Silicon oxide, for example, often exhibits pin holes which permit shorting of the conductive metal films. Also, the silicon oxide cannot be selectively removed above a preceding layer of oxide because the same etchants would attack both layers. Other materials have been proposed, but generally have been unacceptable due to factors such as incompatibility with other process steps or other materials of the monolithic semiconductor device, inadequate insulating properties, etc.

Regardless of the material used as this insulator, it is necessary that the layer be selectively applied. This might be done by physical masking when the layer is applied, but for small geometries this technique does not provide adequate resolution, and in addition a mask could not be used in applying some insulators, lacquer for example, since it would be difficult to remove the mask once the insulator was in place. Thus, photoresist masking and etching is ordinarily used in this environment. This technique consists of applying a layer all over a surface where actually only selected areas are desired to be coated, covering the layer with a photoresist polymer, exposing the photosensitive material to light in the desired pattern, developing the photoresist, then etching away the layer in exposed areas using the photoresist as a mask.

Excellent resolution of fine lines and intricate patterns is obtained by the conventional photoresist technique, but when used to define the insulating layer in a multilayer interconnection arrangement for a monolithic integrated circuit certain disadvantages are present. First, the etching solution used to remove selected areas of the insulating layer may remove portions of underlying layers which should remain intact. Second, the photoresist operation introduces process steps which of course add to the cost of the manufactured devices and, since attrition occurs in virtually any step, the yield is reduced. Most significant, however, is the fact that selective etching of a fairly thick insulating layer as would be used here produces undercutting beneath the edge of the masking layer. This results in a sharp edge around the etched hole, and perhaps even in cantilevering of the top portion of the insulating layer out over a minute portion of the underlying layer. Then, when a thin metal film is deposited over the insulator to make the interconnection and contact, a discontinuity in the conductive strip, or a high resistance region, will exist at the sharp edge.

It is therefore the principal object of this invention to provide an improved method of making semiconductor integrated circuits or the like wherein layers of conductive strips are insulated from one another in a pattern of interconnections. Another object is to provide an insulating medium for multilayer interconnections which does not introduces undesirable properties or consequences during its manufacture.

In accordance with this invention, an insulating layer is provided in a selective manner between two layers of conductive strips or the like by using a photo-definable material which does not require a separate etching operation using photoresist masking. The key feature here is that the insulating layer itself is defined or selectively applied photographically rather than being applied all over the surface and then selectively removed by subsequent photomasking and etching techniques. In a preferred embodiment, the material used in producing this insulating layer is a mixture of glass frit and a photosensitive polymer. The mixture is applied, exposed in the desired pattern, then developed, leaving a layer of glass mixed with the photosensitive material in the desired areas. This remaining material is then heated to fuse the glass. It will be noted that upon fusing the edges of the glass layer slope off to provide a smooth surface for the deposition of metal films. No difficulties in undesired etching of layers other than the insulator are introduced.

Figure 1:
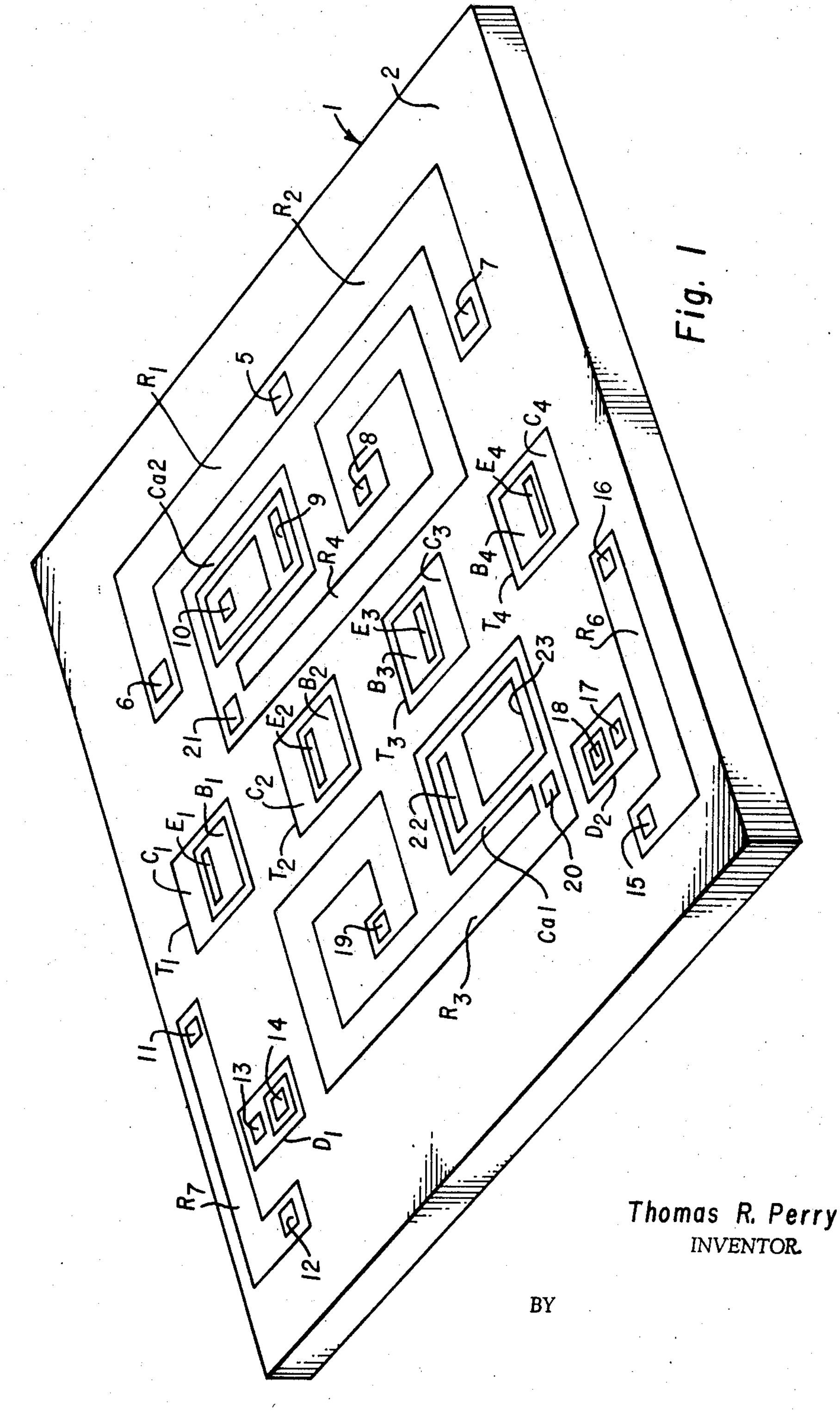
FIGURE 1 shows a semiconductor substrate having various components diffused therein.

To illustrate the various regions of a device using the method of the present invention, the figures have been divided into the various layers of the network. FIGURE 1 shows the semiconductor substrate, with the various regions diffused therein to form transistors, capacitors and resistors.

Referring to FIGURE 1, four transistors $T_1$, $T_2$, $T_3$ and $T_4$ are diffused into the center of the network substrate. Each transistor, for example transistor $T_1$, is formed by triple diffusion, diffusing a collector region $C_1$, a base region $B_1$ and an emitter region $E_1$. First an area $C_1$ is diffused to form the collector. The base $B_1$ is then diffused into a portion of the diffused region $C_1$, and is of opposite conductivity type of impurity material than that of the region $C_1$. In this case, the collector region $C_1$ may, for example, be N-type material, the base region is of P-type material, while the emitter region is of N-type material, diffused into a portion of the base region, the resulting device being a triple-diffused planar transistor having each of the junctions extending to the surface of the substrate. The other transistors $T_2$, $T_3$ and $T_4$, each having a collector, base and emitter, are formed in the same manner.

To form the resistors of the network in the substrate, impurity materials are diffused therein to adjust the resistivity of the wafer within the diffused areas. For example, resistors $R_1$ and $R_2$ are diffused into one portion of the wafer, having one long section and two shorter ones at right angles to the long portion. Three contact areas (6, 5 and 7) are made to the resistors, area 5 being the area of connection to an outside source of power. The portion of the diffused region between areas 5 and 6 constitutes resistor $R_1$ and the diffused region between areas 5 and 7 constitutes resistor $R_2$. A first diffusion is made into the substrate which is of an opposite type conductivity from that of the substrate, thus forming a PN junction along the diffused area. This PN junction presents a high resistance and therefore prevents current from leaking from the resistor into other circuits formed in the substrate. After the PN junction is formed along the diffused path, a second diffusion is made into the first diffused area, preferably of the same conductivity material as the first to adjust the resistance to the desired value. Resistors $R_6$ and $R_7$ are similar to the resistors $R_1$ and $R_2$, resistor $R_6$ having contact areas 15 and 16 and resistor $R_7$ having contact areas 11 and 12.

Two additional resistors $R_3$ and $R_4$ are diffused into the substrate surface in conjunction with two capacitors $Ca_1$ and $Ca_2$. Resistor $R_3$ is joined at one end to one portion of capacitor $Ca_1$ and resistor $R_4$ is joined at one end to one portion of capacitor $Ca_2$.

The capacitors of the network are formed as follows: A first diffused region is made into the substrate similar to the resistor diffusion to create a PN junction between the diffused area and the rest of the surrounding wafer. This diffused region constitutes one plate of the capacitor. An oxide layer, for example, silicon oxide, is then laid down upon the diffused region, said oxide being an insulator, no electrical conduction will occur therethrough. A third layer, this one conductive, is placed upon the oxide layer and forms the other plate of the capacitor. The value of the capacitance of each capacitor may be varied by controlling the type of material used as the dielectric, for example, an oxide of tantalum, and by controlling the areas of the conductors on each side of the dielectric. Capacitor $Ca_1$ has contacts made to areas 23 and 22, each being contacted to the opposite ones of the two conductors of the capacitor. Resistor $R_3$ is connected to or diffused in conjunction with capacitor $Ca_1$, said resistor $R_3$ having contacts at areas 20 and 19.

A third type element is also formed on the surface of the substrate. Diodes $D_1$ and $D_2$ are formed by diffusing one type of conductivity material into the surface of the substrate and then diffusing a material of opposite type conductivity into the first diffused region, forming a PN junction between the two diffused regions. Contact is then made to each region, thus forming a diode. For example, diode $D_2$ has contact areas 17 and 18 and diode $D_1$ has contact areas 13 and 14.

Figure 6:
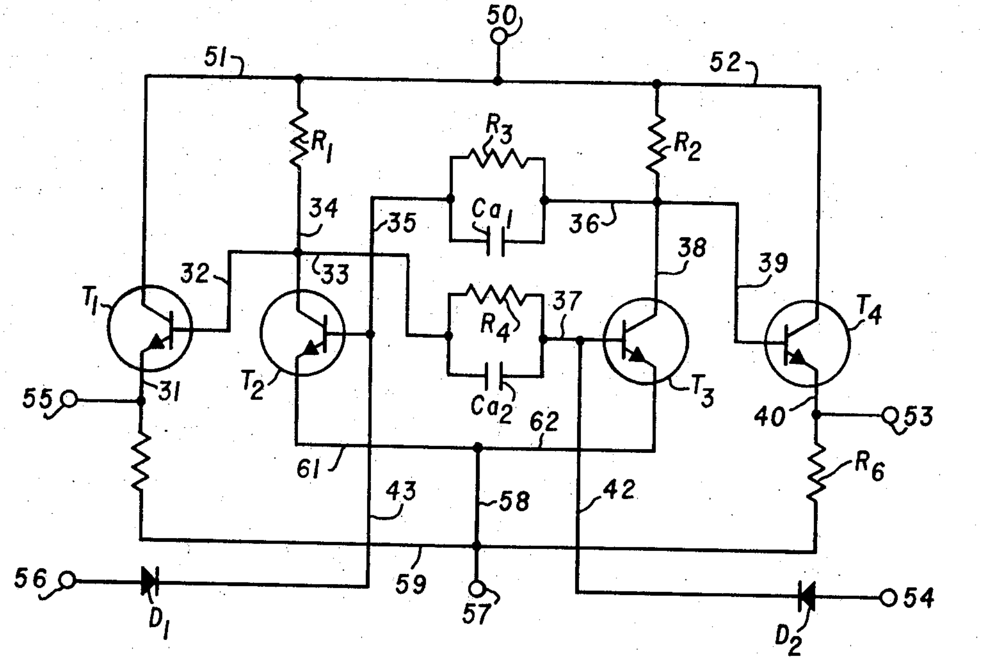
FIGURE 6 is a schematic diagram of the circuit formed by the network, shown in FIGURES 1–4.

The various components which are formed in the surface of the substrate are interconnected according to a predetermined circuit configuration, the components formed in the substrate of FIGURE 1, for example, correspond to the components of the circuit conventionally shown in FIGURE 6, the components in each of FIGURES 1 and 6 having corresponding identical designations.

Figure 2:
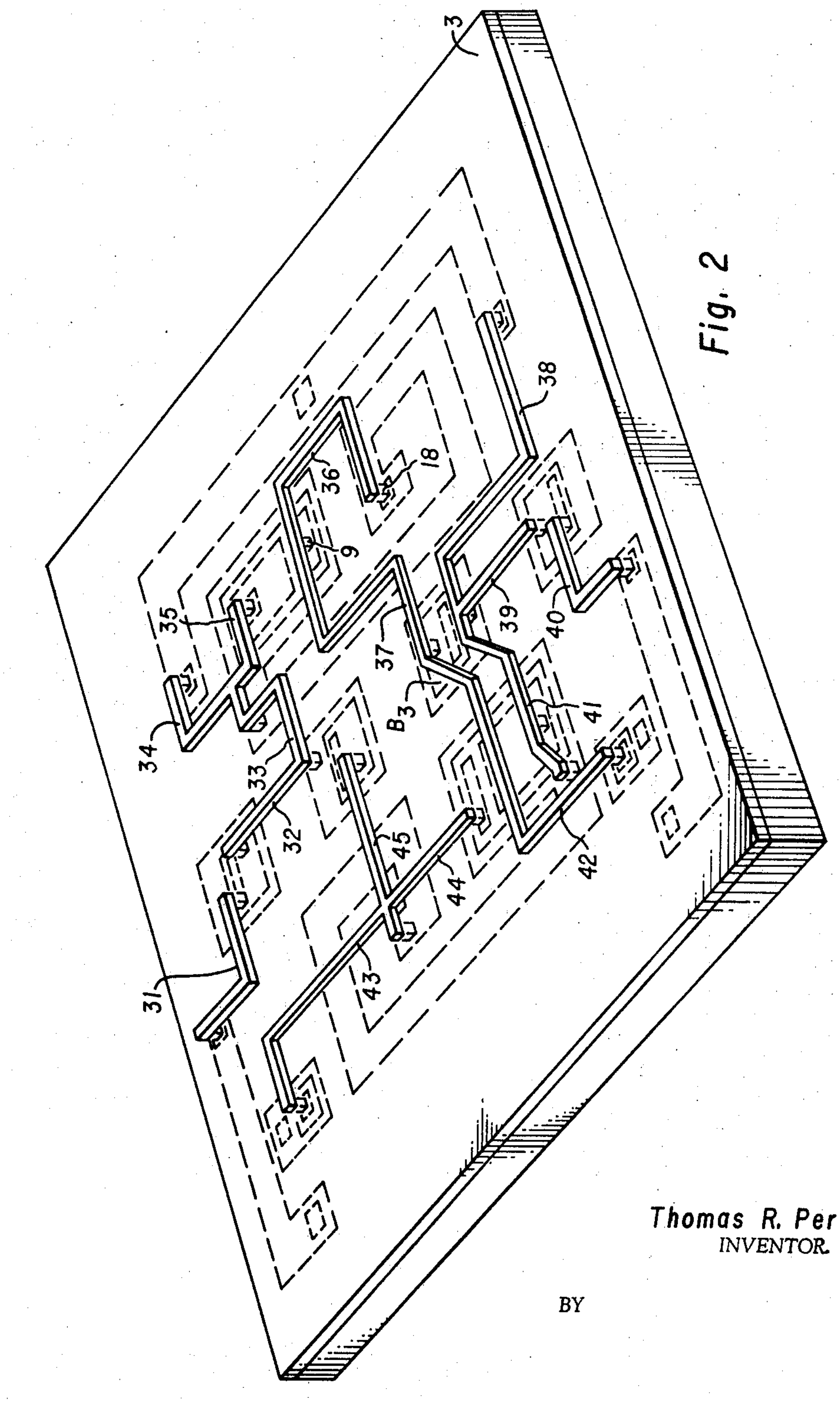
FIGURE 2 shows the substrate of FIGURE 1 with a layer of insulating material over the surface of the substrate, and interconnecting leads formed over the insulating material interconnecting the components at various points.

To protect the components formed in the substrate, and to insulate the interconnecting wire leads shown in FIGURE 2 from the surface of the substrate, an oxide layer 3 (FIG. 2) is first placed upon the surface of the substrate. Any insulating material will serve the purpose, but silicon oxide is the one most commonly used. The oxide is placed down in a specific pattern using photographic techniques. Ordinarily, this layer of oxide would be that which remains in place after the various impurity deposition and diffusion operations used in forming the regions of the components in the semiconductor wafer. Various openings are left in the oxide through which contact is to be made to the different contact areas. In FIGURE 2, the contacts and interconnecting leads are shown contacting various contact areas on the substrate. For example, base $B_3$ of transistor $T_3$ is connected to contact area 9 of capacitor $Ca_2$ by the lead 37. The contact area 9 of the capacitor $Ca_2$ is connected to resistor $R_4$ at contact area 18 by lead 36. Various other areas are connected by the leads shown. Each interconnection corresponds to one of the interconnecting leads shown in FIGURE 6.

The lead wires are formed by depositing a metal on the surface of the oxide and then by photographic techniques etching away the undesired metal, leaving only the interconnections. Any type metal which can be deposited in thin layers may be used, for example, aluminum. However, it is important to make certain that the metal selected will not be harmful to the device or diffusable therein when the substrate is raised to higher temperatures in subsequent sealing operations.

After the interconnections have been made on the surface of the insulating layer as shownin FIGURE 2, a second layer of insulating material is placed over the interconnections and insulating material. This second layer of insulating material is the primary feature of this invention, and serves the purpose of insulating the interconnections shown in FIGURE 2 from other interconnections to the components which are to be made thereto as hereinafter described. It has been found that a thin layer of glass provides the best protection for the device, in that the glass not only seals the device protecting the leads and components therein, but also prevents moisture from reaching the surface of the device and otherwise produce harmful results. The glass may be applied by mixing a glass frit with a photosensitive polymer, an example of this method being described in U.S. Patent No. 3,555,291 issued Nov. 28, 1967, and assigned to the same assignee as the present application. The preferred method is a procedure wherein finely ground glass particles are mixed with a photoresist polymer and applied to the substrate. The glass-polymer coating is exposed to a light through the mask, developed and then fired to fuse the glass particles. The resultant layer of glass is in the pattern of the mask which, in practice, will leave openings through which contact is to be made to the substrate.

While visible or ultraviolet light is ordinarily used to expose the photoresist, other methods may be employed such as a focused electron beam traversing the desired pattern.

The type of glass used may be one of several types, for example, Corning Glass Code 1826 which is a lead boro-silicate glass having approximately the same coefficient wide variety of compositions, but the ones suitable for use with this invention must have a reasonably low fusing temperature and have a thermal expansion coefficient compatible with silicon and silicon oxide, or with whatever other materials are used. Another glass that may be used may be similar to the glass described in U.S. Patent expansion as the silicon substrate. Glass is available in a No. 3,241,010, issued Mar. 19, 1966, and assigned to the same assignee as the present invention. This glass is a lead oxide-silicon dioxide-aluminum oxide glass wherein each of the named components is of a high purity. The glass would be ground to a grain size of 1 mil maximum.

The photosensitive polymer may be of the type disclosed in U.S. Patents 2,670,285, 2,670,286, and 2,670,287 of L. M. Minsk et al. Preferably, a material commercially available under the trade designation KMER, sold by the Eastman Kodak Company, is used. The ratio of glass frit to liquid photosensitive polymer would be about 2 to 1. A solvent or thinner may be added to facilitate handling.

In selecting the glass it is important that sealing temperatures be kept below a temperature of about 925° C. Sealing within these temperatures avoids junction migration which occurs in semiconductor devices. Junction migration is the further diffusion of impurities within the substrate, previously diffused, when the substrate is raised above the upper limit of the above range of temperatures. The migration may possibly cause harmful effects by allowing one diffused area to diffuse into another, which may completely destroy the device or give it undesired characteristics.

Another material suitable for use as the layer 4 is hardened photoresist, without the glass, as described in copending application Ser. No. 415,845 filed Nov. 16, 1964, and assigned to the assignee of this invention.

Figure 3:
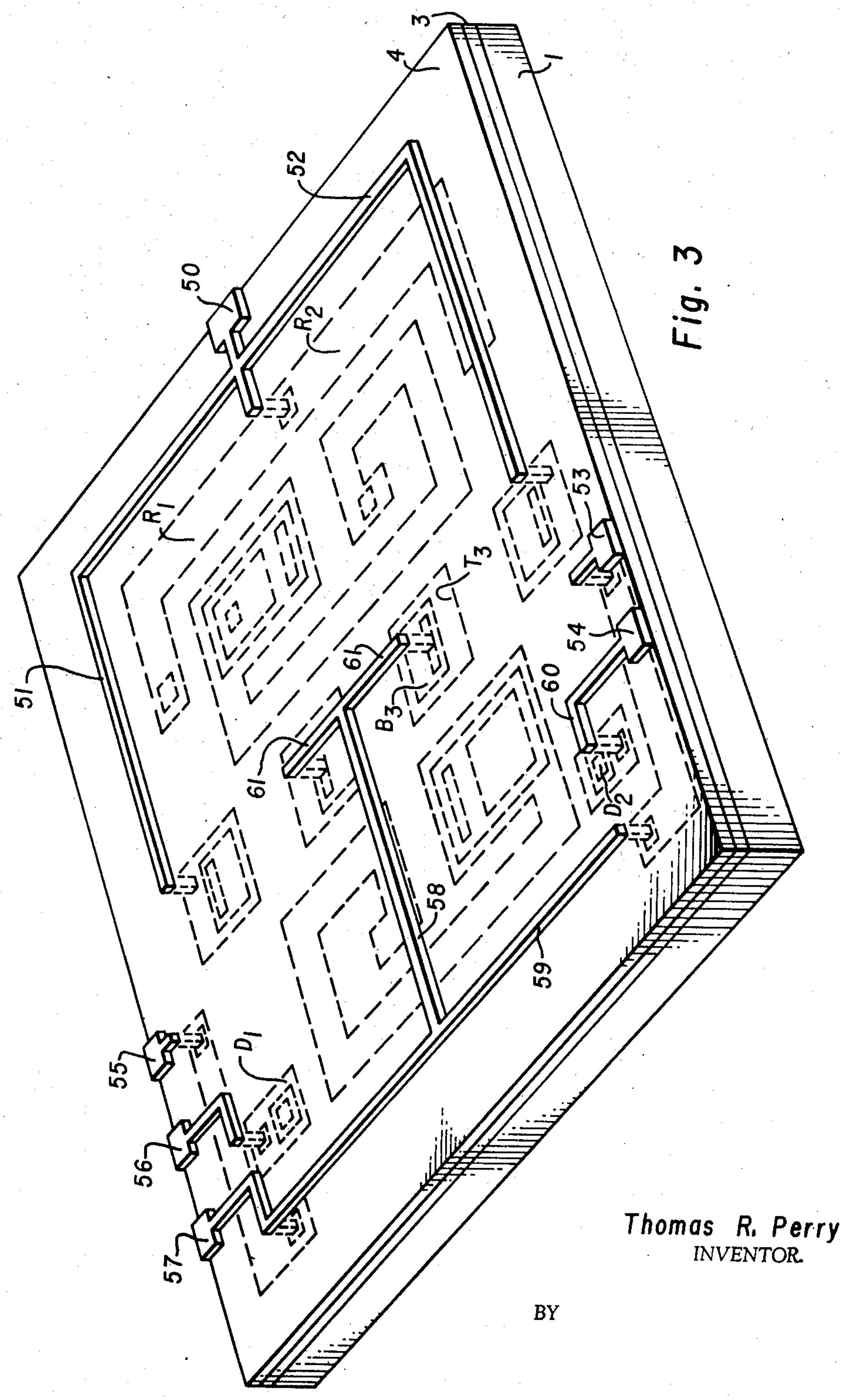
FIGURE 3 shows the network of FIGURE 2 with a second layer of insulating material and interconnecting leads formed thereon with the leads extending down through both layers to contact the components in the substrate.

In FIGURE 3 is shown the wafer 1 with the two layers of insulating material 3 and 4, one layer of interconnections (not shown) which is on said layer 3 and a second network of interconnecting leads on top of the second layer 4. Just as with the previous leads, the second network of leads may be put down by evaporating metal onto specified areas and by photographic techniques removing excess metal by etching. In this particular application, the interconnecting leads shown in FIGURE 3 are the leads on the top layer which terminate at the terminals around the periphery of the wafer, for example, terminals 50, 55, 56, 57, 60, 54 and 53. In comparing FIGURE 3 with FIGURE 6, it may be seen that terminal 55 is attached to the emitter of $T_1$, terminal 53 is attached to the emitter of $T_4$, these two terminals representing the output terminals of the device. Terminal 50, one power input terminal, connects to the collectors of transistors $T_1$ and $T_4$ and to the collectors of transistors $T_2$ and $T_3$ through resistors $R_1$ and $R_2$, respectively. Terminals 56 and 54 are the input to the circuit through diodes $D_1$ and $D_2$ and terminal 57 is another power input terminal. The interconnections shown in FIGURE 3 go through the insulating layers and are connected to the various components in the wafer.

The circuit selected for purposes of illustration has intentionally been kept relatively simple in order that the various aspects of the invention may be clearly portrayed and described. More complicated networks of interconnecting leads may be placed upon circuits having interconnections between each layer and the surface of the device, and having interconnections between the various layers containing the interconnecting leads.

Figure 4:
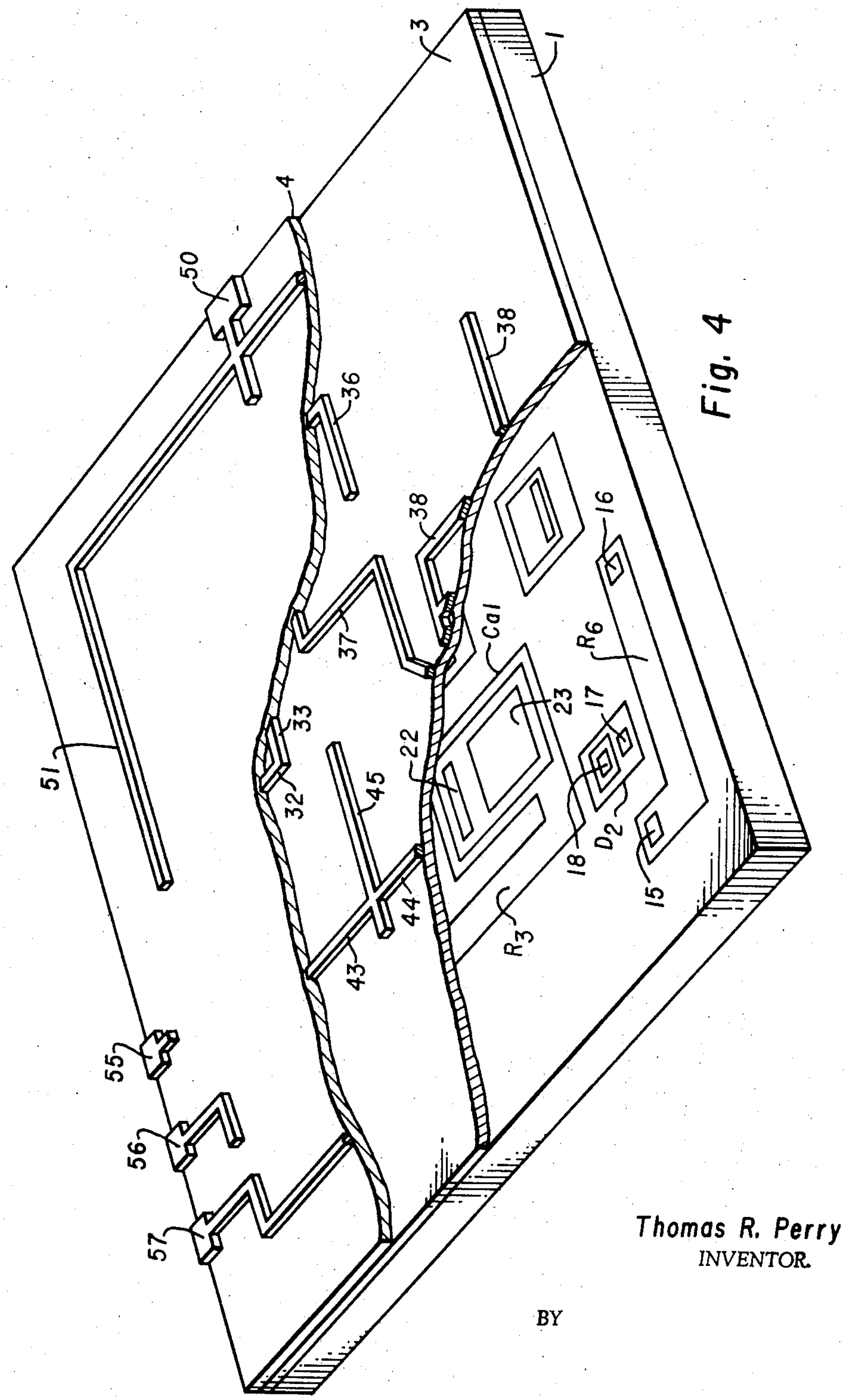
FIGURE 4 is a completed network shown in partial section to show the various layers and interconnections thereon.

FIGURE 4 is a drawing of a network shown in partial section. The oxide layer 3 is partially removed showing various diffused components. Layer 3 has been exposed by removing a portion of the layer 4. Various interconnections are shown on layer 3 as they emerge from under layer 4 and overlie the surface of layer 3. On layer 4, several of the terminal areas (50, 55, 56 and 57) are shown illustrating one advantage of the invention, in that the terminal areas may be made large to facilitate making connections thereto.

Figure 5:
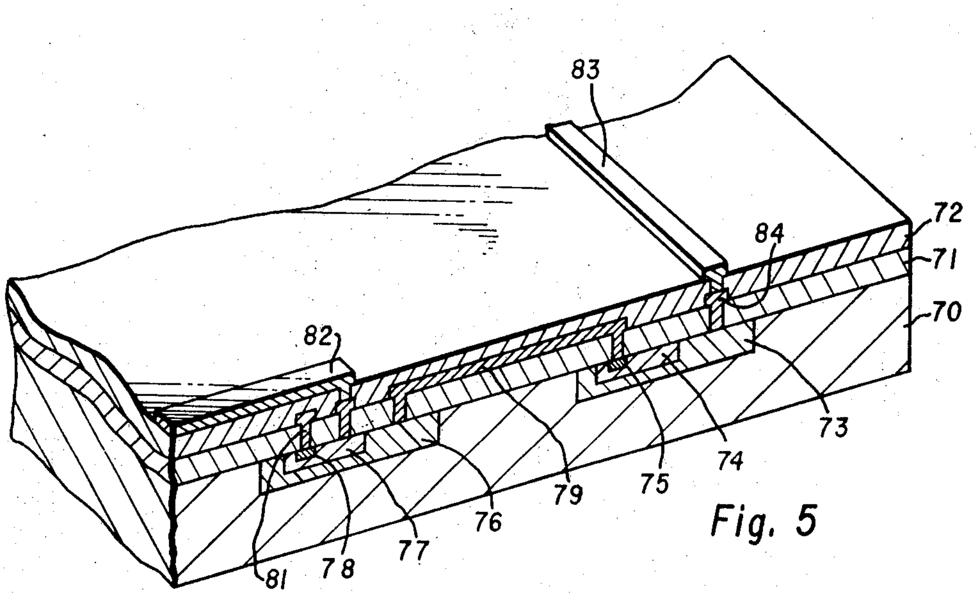
FIGURE 5 is a cross-sectional view of one portion of a completed network taken across two transistors formed therein.

FIGURE 5 shows a view in cross section of a typical device having two transistors therein. Other components may be in such networks, but for simplicity and to illustrate the principle of interconnecting leads in various layers of insulation, only two components are shown. Shown is a substrate 70 with layers 71 and 72 of insulating material thereon. One transistor consists of a collector region 76, base region 77 and an emitter region 78. The other transistor has collector region 73, base region 74 and the emitter region 75. Emitter region 75 of one transistor is connected to the collector region 76 by the interconnecting lead 79. The base region 77 is connected to an external lead 82 on the surface of the inslating material 72 while the emitter region 78 is connected to interconnecting lead 81 which lies between the first and second insulating layers. Contact area 84 connects collector 73 in the same manner as an interconnecting lead between the two layers of insulating material.

FIGURE 6 illustrates a convention electrical schematic of the interconnected circuit compounds formed by the integrated circuit of the FIGURES 1–4.

It is to be understood that the above-described examples are merely illustrative of the application of the invention. Numerous other arrangements may be devised by those skilled in the art without departing from the spirit and scope of the invention as defined by the appended claims.

What is claimed is:

1. The method of making a network on a semiconductor substrate, comprising the steps of forming electronic components by diffusion into the surface of said substrate, selectively applying a layer of insulating material over a portion of said substrate, applying conducting material upon said insulating layer in ohmic contact with exposed portions of said semiconductor substrate, selectively removing a portion of said conductive material to form contacts and interconnections for said diffused components, applying a second layer of photo-definable insulating material over said conductive material in selected areas by laying down a photosensitive coating, then exposing the coating in the desired pattern, then developing, applying conductive material over said second layer of insulating material, and selectively removing a portion of said conductive material over said second layer to form additional contacts and interconnections for said network.

2. The method of making a network on a semiconductor substrate, comprising the steps of forming components at one surface of said substrate, alternately applying layers of insulating material and conductive material respectively upon said surface of said substate at predetermined areas, and removing a portion of each layer of conductive material to form contacts to said components and interconnections for said network prior to any subsequent deposition of insulating material.

3. In a method of making interconnections in electrical devices, the steps of applying a first pattern of conductive strips in ohmic contact with preselected contact areas on a face of the device and separated from the remainder of said face by an insulating layer, applying a layer of photo-definable material over said first pattern, exposing said photo-definable material in a predetermined pattern, developing the photo-definable material to define another insulating coating, and then applying a second pattern of conductive strips over said another insulating coating.

References Cited

UNITED STATES PATENTS

| | | | |
|---|---|---|---|
| 3,266,127 | 8/1966 | Harding et al. | |
| 3,292,128 | 12/1966 | Hall | 29—577 X |
| 3,312,871 | 4/1967 | Seki et al. | 317—101 |

PAUL M. COHEN, Primary Examiner

U.S. Cl. X.R.

29—578, 625; 174—68.5; 317—101